United States Patent [19]

Murakami et al.

[11] Patent Number: 5,464,662

[45] Date of Patent: Nov. 7, 1995

[54] FABRICATION METHOD OF PRINTED WIRING BOARD

[75] Inventors: Tomoo Murakami; Takanori Tsunoda, both of Tokyo, Japan

[73] Assignee: NEC Corporation, Tokyo, Japan

[21] Appl. No.: 300,131

[22] Filed: Sep. 2, 1994

[30] Foreign Application Priority Data

Sep. 3, 1993 [JP] Japan ................................. 5-219367

[51] Int. Cl.⁶ ....................................... B05D 5/12
[52] U.S. Cl. .................... 427/510; 427/96; 427/259; 427/264; 427/265; 427/270; 427/271; 427/272; 427/282; 427/331; 427/404; 427/407.1; 427/558; 427/559; 427/595
[58] Field of Search .................... 427/558, 595, 427/96, 265, 271, 331, 404, 559, 510, 259, 264, 270, 272, 282, 407.1

[56] References Cited

FOREIGN PATENT DOCUMENTS 3-268479  11/1991  Japan .

*Primary Examiner*—Bernard Pianalto
*Attorney, Agent, or Firm*—Young & Thompson

[57] ABSTRACT

A fabrication method of a printed wiring board in which the halation effect of light irradiated to a solder resist film is utilized in a process of selectively removing the solder resist film. After a conductive layer is patterned to a given circuit pattern including soldering pads, the solder resist film is formed on the base material to cover the patterned conductive layer. The solder resist film is selectively exposed to light utilizing reflection of the irradiated light from the insulating base material and developed so that the solder resist film is selectively left in areas adjacent to the respective soldering pads. Then, an etching resist film is formed to cover the patterned conductive layer except for the soldering pads, and surface areas of the respective soldering pads are selectively etched using the etching resist film as a mask to produce solder resist dams made of the solder resist film left on the base material. Solder films are formed on the respective soldering pads thus selectively etched. Electronic components can be soldered on the soldering pads with satisfactory reliability even if the soldering pads have narrow pitches such as 500 μm or less.

8 Claims, 5 Drawing Sheets

FABRICATION METHOD OF PRINTED WIRING BOARD

BACKGROUND OF THE INVENTION

1. Field of the Invention

The present invention relates to a fabrication method of a printed wiring board and more particularly, to a fabrication method of a high-density printed wiring board having fine-pitch soldering pads.

2. Description of the Prior Art

Conventionally, to prevent solder bridges from being formed on a high-density printed wiring board having fine-pitch soldering pads during a soldering process, melted solder has been stopped flowing by blocking dams made of solder resist whose surfaces are higher than those of the soldering pads. In general, the blocking dams have been constructed by either (a) applying solder resist ink on one surface or both surfaces of the wiring board through a screen printing process, then to cure or harden the ink thus printed, or by (b) coating photosensitive solder resist on one surface or both surfaces of the wiring board, selectively exposing the solder resist film thus formed using a mask, then develop the solder resist film thus exposed.

With such conventional method, in case the thickness of the pitches of the soldering pads being 500 μm or less, however, there is a problem in positional adjustment or matching in (a) the printing process of the solder resist ink or in (b) the exposure process of the photosensitive solder resist film becomes very difficult and as a result, the solder blocking dams cannot be provided with sufficient precision.

To solve this problem, a fabrication method of a printed wiring board as shown in FIGS. 1A to 1D has been developed, which is disclosed in the Japanese Non-Examined Patent Publication No. 3-268479.

Though the printed wiring board has a plurality of soldering pads 21a, lands 21b, wiring lines 21c and through holes 22, to simply description, only one of the through holes 22, two of the lands 21b corresponding to the one hole 22, three of the wiring lines 21c adjacent to the through hole 22 are shown in FIGS. 1A, 1B, 1C and 1D.

With this conventional fabrication method, first, a copperclad laminate 23 composed of a sheet-like insulating base material and first and second copper foils fixed to each surface of the base material is prepared. The through holes 22 are formed through the laminate 23 and conductive metal such as copper is plated on the inner walls of the respective through holes 22 to interconnect the first and second copper foils with each other.

Next, etching resist films 25 having given circuit patterns are respectively formed on the first and second copper foils, and both of the copper foils are selectively etched using the patterned etching resist films 25 as masks to form the given circuit patterns on each surface of the base material, respectively.

Thus, as shown in FIG. 1A, the soldering pads 21a, lands 21b and wiring lines 21c are formed on a first surface of the base material and the lands 21b and wiring lines 21c are formed on a second surface thereof. The lands 21b on the first and second surfaces are interconnected with each other through the corresponding plated through holes 22.

Without removing the etching resist films 25, solder resist material is coated to cover the respective copper foils so that solder resist films 24a and 24b are formed on the first and second surfaces of the base material, respectively.

Thereafter, the surface areas of the solder resist films 24a and 24b are removed by grinding using a belt grinding machine until the tops of the soldering pads, and 21b and the wiring lines 21c are exposed from the solder resist films 24a and 24b, respectively. The etching resist films 25 on both copper foils are removed during this grinding process.

Thus, as shown in FIG. 1B, the surfaces of the unremoved solder resist film 24a, and soldering pads 21a, lands 21b as well as the wiring lines 21c are the same in height thereby forming a flat plane over the first surface of the base material. Similarly, the surfaces of the unremoved solder resistant film 24b and soldering pads 21b and the wiring lines 21c are also of the same thereby forming another even plane over the second surface of the base material. At this time, the etching resist films 25 in the respective through holes 22 are not removed.

Next, surface areas of the soldering pads 21a, lands 21b and wiring lines 21c are selectively etched to given depths so that solder resist dams 24a and 24b are produced on the first and second surfaces of the base material, respectively, as shown in FIG. 1C. Subsequently, the etching resist films 25 remaining in the through holes 22 are removed.

Thus, the structure as shown in FIG. 1D is obtained, in which the blocking dams made of the remaining solder resist films 24a and 24b are formed adjacent to the soldering pads 21a, lands 21b and wiring lines 21c, respectively.

Subsequently, though not shown, melted solder is poured on soldering pads 21a and lands 21b to form solder films thereon, respectively, resulting in a printed wiring board.

Desired electronic components or devices are placed on the soldering pads 21a and/or the lands 21b to be mounted by soldering in an assembly process of the printed wiring board.

Due to the solder resist dams 24a and 24b, even if the electronic components or devices are soldered to be mounted on the soldering pads 21a and/or the lands 21b at narrow pitches such as 500 μm or less, solder bridges are prevented from being formed.

With the conventional fabrication method shown in FIGS. 1A, 1B, 1C and 1D however, there are the following problems:

(1) Since soldering pads 21a, lands 21b and wiring lines 21c are exposed from the solder resist films 24a and 24b through the grinding process, thicknesses of pads 21a, lands 21b and lines 21c are difficult to be controlled precisely. As a result, satisfactory soldering reliability cannot be ensured.

(2) Since grinding process is needed, fabrication cost increases.

(3) Because the patterned first and second copper foils of the copper clad laminate are entirely exposed through the grinding process, solder resist is necessary to be coated again to cover both copper foils in their entirety except for areas not to be soldered.

SUMMARY OF THE INVENTION

Accordingly, an object of the present invention is to provide a fabrication method of a printed wiring board in which electronic components and/or devices can be soldered on a printed wiring board with satisfactory reliability even if soldering pads formed on the wiring board have narrow pitches such as 500 μm or less.

Another object of the present invention is to provide a fabrication method of a printed wiring board which can produce a printed wiring board without a grinding process.

Still another object of the present invention is to provide a fabrication method of a printed wiring board in which a patterned conductive layer or layers of a printed wiring board are not entirely exposed through a process of forming solder resist dams, and in which no additional process of coating solder resist is required.

A fabrication method of a printed wiring board according to the present invention contains the following steps (a) to (f). The printed wiring board has an insulating base material and a conductive layer fixed to a surface of the base material.

(a) The conductive layer is patterned to a given circuit pattern including soldering pads.

(b) A solder resist film is formed on the base material to cover the patterned conductive layer.

(c) The solder resist film is selectively exposed to light and developed so that the solder resist film is selectively left in areas adjacent to the respective soldering pads. The selective exposure is carried out utilizing reflection of the irradiated light from the insulating base material.

(d) An etching resist film is formed to cover the patterned conductive layer except for the soldering pads.

(e) Surface areas of the respective soldering pads are selectively etched using the etching resist film as a mask to produce solder resist dams made of the solder resist film selectively left on the base material.

(f) Solder films are formed on the respective soldering pads etched.

With the fabrication method of a printed wiring board according to the present invention, the solder resist film is selectively exposed by irradiation of light and developed so that the solder resist film is selectively left in the areas adjacent to the respective soldering pads, and the selective exposure is carried out utilizing reflection of the irradiated light from the insulating base material.

Accordingly, thickness of the soldering pads can be controlled precisely, and as a result, electronic components and/or devices can be soldered on the soldering pads with satisfactory reliability even if the soldering pads have narrow pitches such as 500 µm or less.

Also, a printed wiring board can be produced without a grinding process, so that there is no increase in fabrication cost.

Further, according to the method of the invention, the etching resist film is formed to cover the patterned conductive layer except for the soldering pads, and then, the surface areas of the respective soldering pads are selectively etched using the etching resist film as a mask to produce the solder resist dams. Therefore, the patterned conductive layer is not entirely exposed through the process of forming solder resist dams, which means that no additional process of coating solder resist is required.

In a preferred embodiment, in the step (c) of selectively exposing and developing the solder resist film, the light with excessive exposure energy is irradiated to the solder resist film so that peripheral areas of the respective soldering pads are covered with the solder resist film left in areas adjacent to the respective soldering pads.

DESCRIPTION OF THE PREFERRED EMBODIMENTS

Preferred embodiments of the present invention will be described below while referring to FIGS. 2A, 2B, 2C, 2D, 2E and 2F and FIGS. 3A, 3B, 3C, 3D, 3E and 3F.

[FIRST EMBODIMENT]

FIGS. 2A, 2B, 2C, 2D, 2E and 2F show a fabrication method of a printed wiring board according to a first embodiment. Though the printed wiring board has a plurality of soldering pads $1a$, lands $1b$, wiring lines $1c$ and through holes 2, for simplicity of description, only one of the through holes 2, three of the soldering pads $1a$, two of the lands $1b$ corresponding to the one hole 2, one of the wiring lines $1c$ adjacent to the through hole 2 are shown in these figures.

First, a copper-clad laminate 3 composed of a sheet-like insulating base material and first and second copper foils respectively fixed to first and second surfaces of the material is prepared. The through holes 2 are formed through the laminate 3 and conductive metal such as copper is plated on the inner walls of the respective through holes 2 to interconnect the first and second copper foils by a tenting process or the like.

Next, etching resist films (not shown) having given circuit patterns are respectively formed on the first and second copper foils, and then, both of the copper foils are selectively etched using the patterned etching resist films as masks to form the given circuit patterns on each surface of the base material, respectively.

Figure 1A:
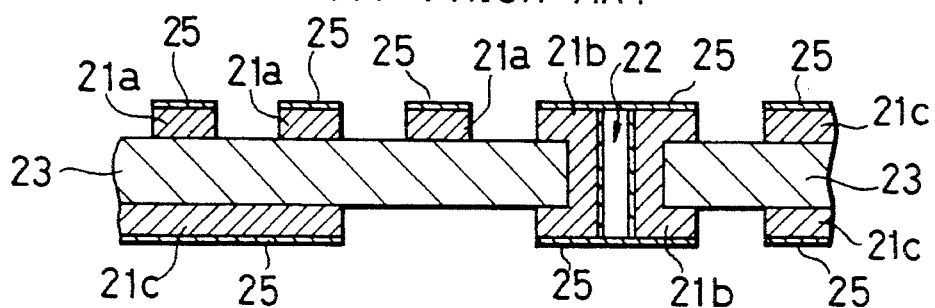
FIGS. 1A, 1B, 1C and 1D are partial cross-section views showing process steps of a conventional fabrication method of a printed wiring board.
Figure 1B:
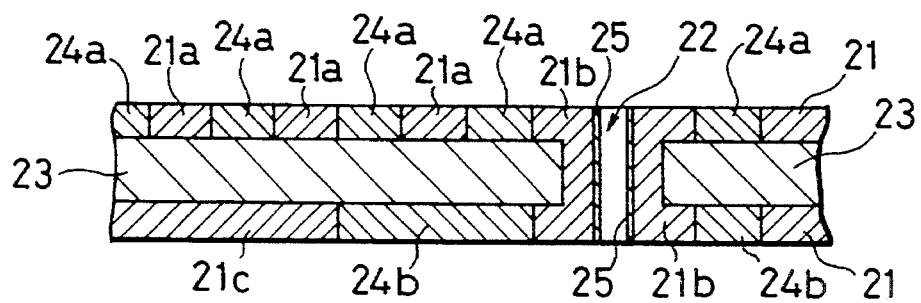
Figure 1C:
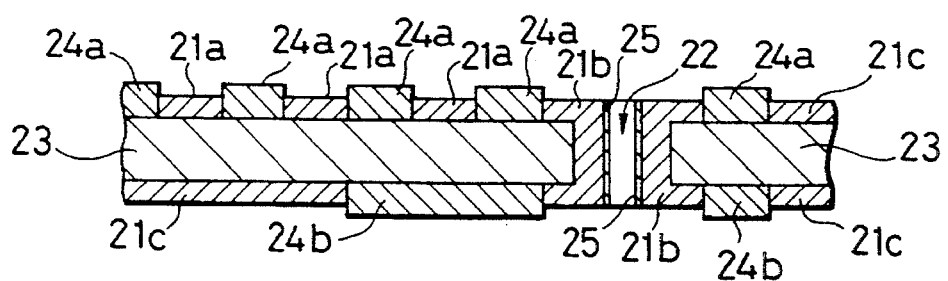
Figure 1D:
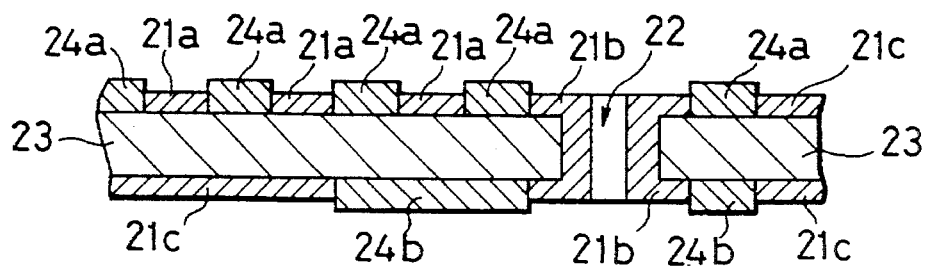
Figure 2A:
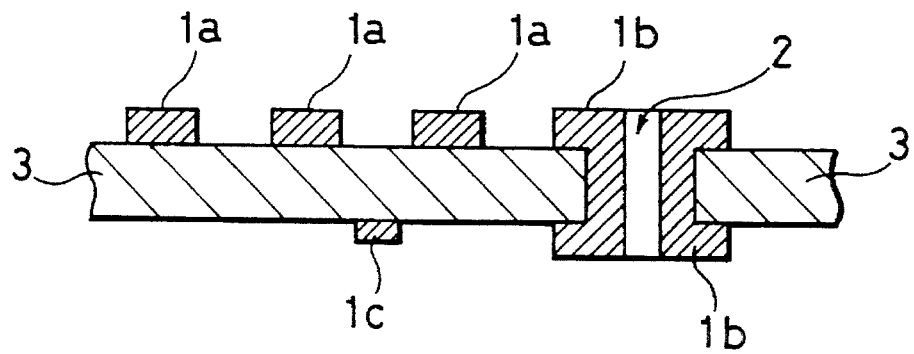
FIGS. 2A, 2B, 2C, 2D, 2E and 2F are partial cross section views showing process steps of a fabrication method of a printed wiring board according to a first embodiment of the present invention.

Thus, as shown in FIG. 2A, the soldering pads $1a$, the land $1b$ and the wiring line $1c$ are formed on the first surface of the base material, and the land $1b$ and the wiring line $1c$ are formed on the second surface thereof. The two lands $1b$ on the first and second surfaces are interconnected with each other through the plated through hole 2.

Figure 2B:
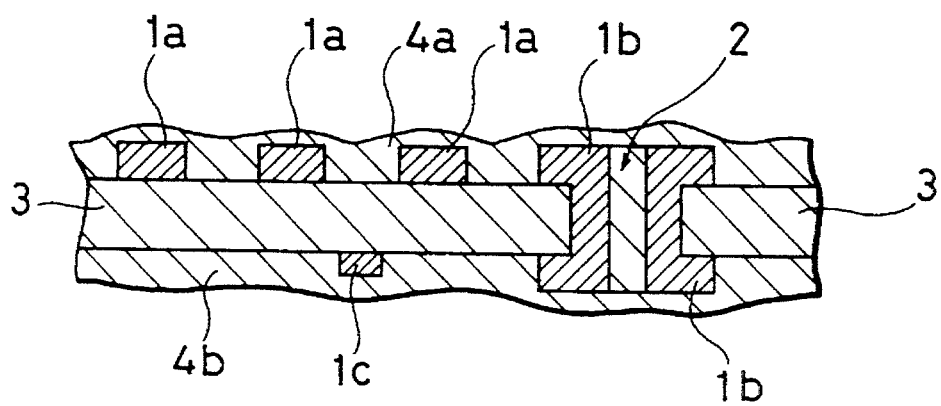

After removing the etching resist films on the first and second copper foils, solder resistant material is coated by a screen printing process to cover the respective copper foils so that solder resistant films $4a$ and $4b$ are formed on the first and second surfaces of the base material, respectively, as shown in FIG. 2B.

The solder resist used here is highly photosensitive so that minimum optical energy required for initiating polymerization of the solder resist material is about one-fifth (⅕) of that of the ordinary-photosensitive one. For example, the minimum optical energy of the high-photosensitive solder resist ranges from 50 to 100 mJ/cm$^2$, on the other hand, that of the ordinary-photosensitive solder resist is about 500 mJ/cm$^2$.

The optical energy of the UV light applied to the solder resist is 500 mJ/cm$^2$.

In the embodiment, the solder resist films $4a$ and $4b$ are about 40 µm in thickness on the first and second surfaces of the base material, and about 15 µm in thickness on the surfaces of the first and second copper foils patterned, respectively.

The solder resist films $4a$ and $4b$ are selectively exposed to ultraviolet (UV) light. The UV light irradiated to the solder resist film passes through films $4a$ and $4b$ to reach the insulating base material of copper-clad laminate 3, on first areas where the soldering pads 1a are not provided. The light is then reflected by the base material so that the solder resist films 4a and 4b on the first areas are irradiated by the reflected light. That is, the solder resist films 4a and 4b on the first areas are irradiated twice by the UV light. As a result, the films 4a and 4b on the first areas are sufficiently cured due to polymerization.

The light is reflected by the surface or inside of the base material since the base material generally contains papers and/or glass sheets for reinforcement.

On the other hand, on second areas where the soldering pads 1a are provided, the UV light is not reflected by the base material because of the soldering pads 1a. Therefore, the solder resist films 4a and 4b on the second areas are not irradiated by the reflected light. That is, the solder resist films 4a and 4b on the second areas are irradiated only once by the UV light. As a result, films 4a and 4b on the second areas are not cured sufficiently due to polymerization.

Thus, solder resist films 4a and 4b only on the first areas where soldering pads 1a are not provided can be selectively cured sufficiently.

In other words, solder resist films 4a and 4b are selectively cured by positively utilizing the "halation effect" of the UV light. The halation effect is not preferable for the exposure processes in general, so that the effect has been avoided as much as possible.

Though soldering pads 1a covered with the solder resist film 4b is not shown in FIGS. 2B, 2C, 2D, 2E and 2F, film 4b is selectively cured in the same way as that of solder resist film 4a described herein.

Figure 2C:
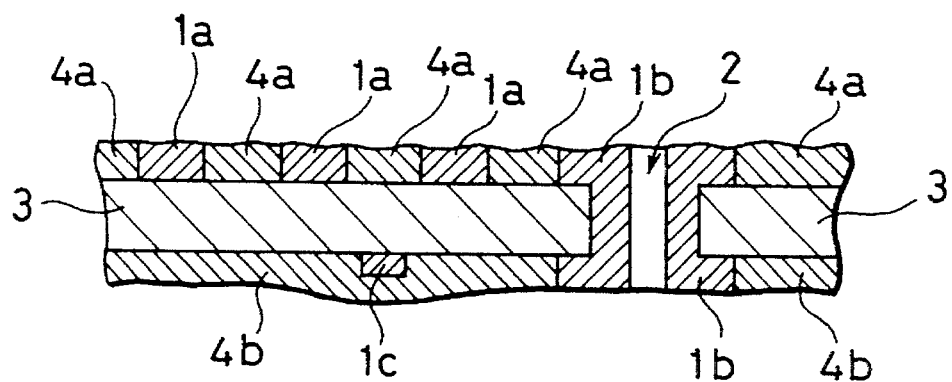

The solder resist films 4a and 4b thus cured are then developed. Through the development, the films 4a and 4b are selectively removed to be left on only the first areas where soldering pads 1a are not provided, as shown in FIG. 2C.

Figure 2D:
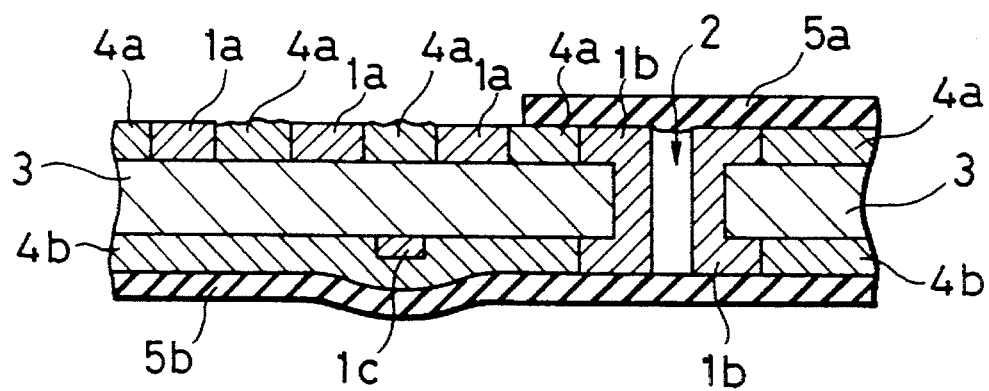

Next, as shown in FIG. 2D, etching resist films 5a and 5b are respectively formed on the first and second surfaces of laminate 3 to cover the patterned first and second copper foils except for soldering pads 1. The remaining solder resist films 4a and 4b may or may not be covered with the etching resist films 5a and 5b, respectively. Here, the remaining solder resist films 4a and 4b are partially covered with the etching resist films 5a and 5b.

Any sort of etching resist material is applicable for this process and thicknesses of etching resist films 5a and 5b are optional. In the embodiment, dry films are employed as etching resist films 5a and 5b.

Figure 2E:
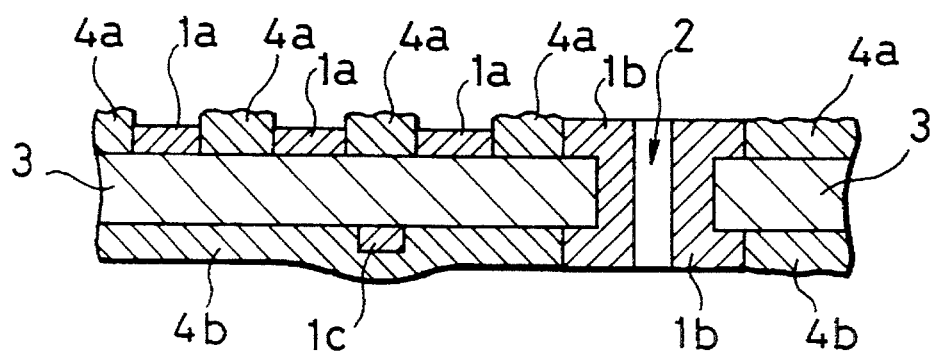

Subsequently, using the etching resist films 5a and 5b as masks, the surface areas of soldering pads 1a are selectively etched by about 10 µm in depth. Thus, the soldering pads 1a become slightly smaller in height than the remaining solder resist film 4a, resulting in blocking dams for stopping solder flow from forming adjacent the respective soldering pads 1a, as shown in FIG. 2E, which are made of the solder resist film 4a on the first areas.

In the embodiment, cupric chloride ($CuCl_2$) is employed as an etchant, however, any sort of etchants is applicable for this process. The resist films 5a and 5b thus etched are about 30 µm in thickness.

Figure 2F:
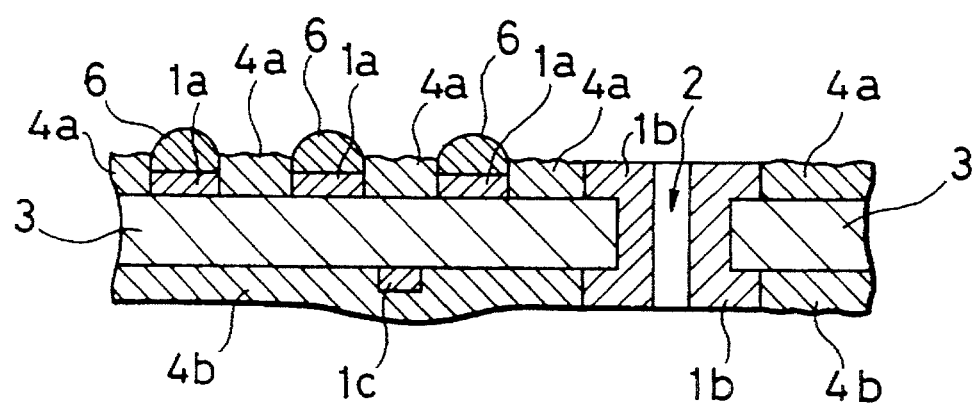

Then, solder paste is selectively coated by a screen printing process on the respective soldering pads 1 and is reflown. Thus, as shown in FIG. 2F, solder films 6 of about 20 µm in thickness are formed on the respective soldering pads 1, resulting in a printed wiring board.

In a subsequent assembly process, desired electronic components and/or devices are placed on the soldering pads 1a to be mounted by soldering.

With the fabrication method of the embodiment, the solder resist films 4a and 4b are selectively exposed by irradiation of the UV light utilizing the halation effect and developed, so that the solder resist films 4a and 4b are selectively left in the first areas adjacent to the respective soldering pads 1a.

Accordingly, thickness of the soldering pads 1a can be controlled precisely so that thicknesses of pads 1a are in accordance with designed values, and as a result, the electronic components and/or devices can be soldered on the respective soldering pads 1a with satisfactory reliability even if the soldering pads 1a have narrow pitches such as 500 µm or less.

Also, fabrication cost of the board does not increase because no grinding process is needed.

Since the etching resist films 5a and 5b are formed to cover the patterned copper foils except for the soldering pads 1a, and then, the surface areas of the respective soldering pads 1a are selectively etched using the etching resist films 5a and 5b as masks to produce the solder resist dams, the patterned copper foils are not entirely exposed through the process of forming the solder resist dams. This means that no additional process of coating solder resist is required.

There is an additional advantage that reliability in soldering interconnection can be improved since solder films 6 with thicknesses of 20 µm or more can be precoated on the respective soldering pads 1a.

[SECOND EMBODIMENT]

FIGS. 3A to 3F show a fabrication method of a printed wiring board according to a second embodiment. Similar to the first embodiment, though the printed wiring board has a plurality of soldering pads 11a, lands 11b, wiring lines 11c and through holes 12, for simplicity of description, only one of the through holes 12, three of the soldering pads 11a, two of the lands 11b corresponding to the one hole 12, one of the wiring lines 11c adjacent to the through hole 12 are shown in these figures.

First, a copper-clad laminate 13 composed of a sheet-like insulating base material and first and second copper foils respectively fixed to first and second surfaces of the material is prepared. The through holes 12 are formed through the laminate 13 and conductive metal such as copper is plated on the inner walls of the respective through holes 12 to interconnect the first and second copper foils by a tenting process or the like.

Next, etching resist films (not shown) having given circuit patterns are respectively formed on the first and second copper foils, and then, both of the copper foils are selectively etched using the patterned etching resist films as masks to form the given circuit patterns on each surface of the base material, respectively.

Figure 3A:
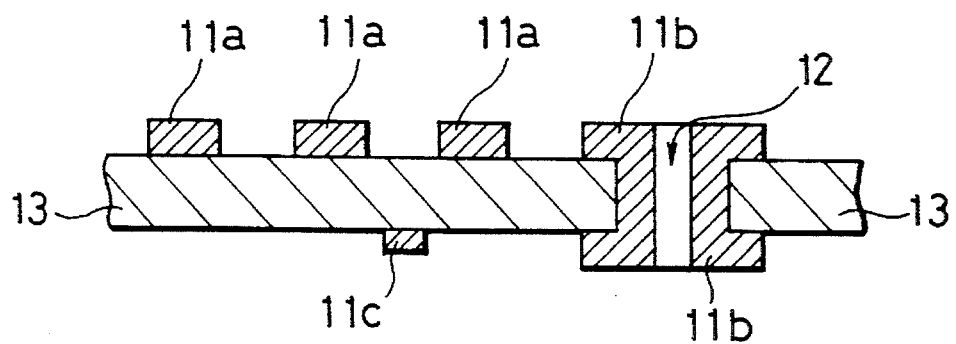
FIGS. 3A, 3B, 3C, 3D, 3E and 3F are partial cross section views showing process steps of a fabrication method of a printed wiring board according to a second embodiment of the present invention.

Thus, as shown in FIG. 3A, soldering pads 11a, land 11b and wiring line 11c are formed on the first surface of the base material and land 11b and wiring line 11c are formed on the second surface thereof. The two lands 11b on the first and second surfaces are interconnected through the plated through hole 12.

Figure 3B:
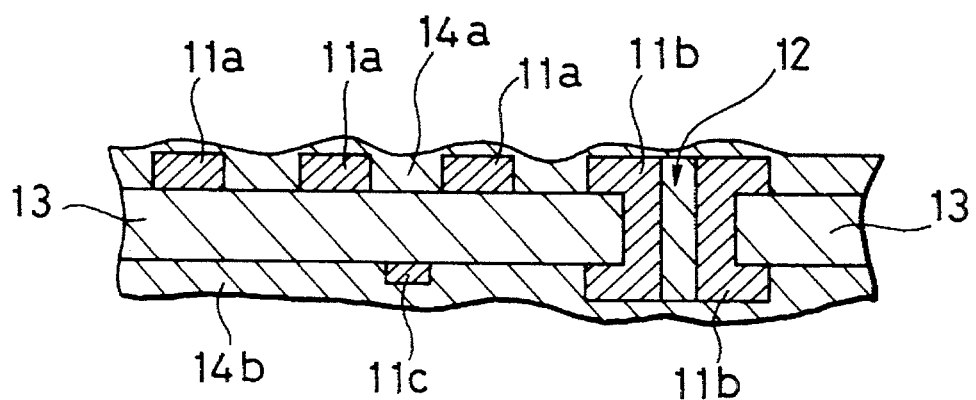

After removing the etching resist films on the first and second copper foils, solder resist is coated by a screen printing process to cover the respective copper foils so that solder resist films 14a and 14b are formed on the first and second surfaces of the base material, respectively, as shown in FIG. 3B.

The solder resist used here is highly photosensitive so that minimum optical energy required for initiating polymerization of the solder resist material is about one-fifth (⅕) of that of the ordinary-photosensitive one. For example, the minimum optical energy of the high-photosensitive solder resist ranges from 50 to 100 mJ/cm$^2$.

Also in the second embodiment, solder resist films 14a and 14b are about 40 μm in thickness on the first and second surfaces of the base material, and about 15 μm in thickness on the surfaces of the first and second copper foils patterned, respectively.

The above process steps are the same as those of the first embodiment.

Due to the same reason as that of the first embodiment, the solder resist films 14a and 14b are selectively exposed to ultraviolet (UV) light, so that films 14a and 14b on the first areas where soldering pads 11a are not provided are sufficiently cured due to polymerization. The solder resist films 14a and 14b on the second areas where the soldering pads 11a are provided are not cured sufficiently.

Though the soldering pads 11a covered with the solder resist film 14b are not shown in FIGS. 3B, 3C, 3D, 3E and 3F, the film 14b is selectively cured in the same way as that of the solder resist film 14a.

Figure 3C:
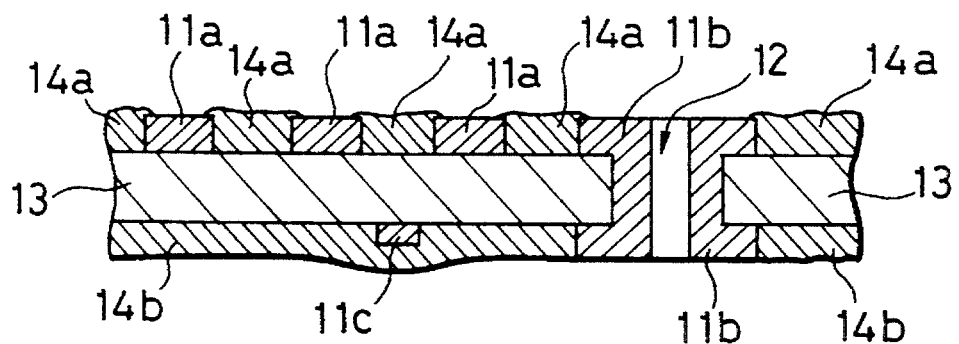

Through the development process, films 14a and 14b are selectively removed to be left on only the first areas where the soldering pads 11a are not provided, as shown in FIG. 3C.

Also in the second embodiment, the same high-photosensitive solder resist as that of the first embodiment is used, in which its minimum optical energy ranges from 50 to 100 mJ/cm$^2$. However, different from the first embodiment, the optical energy of the UV light applied to the solder resist is 700 to 750 mJ/cm$^2$ which is 1.4 to 1.5 times as much as that (500 mJ/cm$^2$) of the ordinary-photosensitive solder resist.

In this case, since the applied optical energy is excessive, the reflected light by the base material reaches the peripheral areas of the respective soldering pads 11a. As a result, as shown in FIG. 3C, the solder resist films 14a and 14b on the first areas are cured so that the upper peripheries of the remaining films 14 and 14b project outside. In other words, the upper peripheries of the films 14a and 14b are placed on the respective soldering pads 11a.

The optical energy of the UV light applied to the solder resist is preferably 700 to 1100 mJ/cm$^2$ which is 1.4 to 2.2 times as much as that (500 mJ/cm$^2$) of the ordinary-photosensitive solder resist. If the energy is less than 700 mJ/cm$^2$, the respective soldering pads 11a are not sufficiently covered with the upper peripheries of the films 14a and 14b. If the energy is more than 1100 mJ/cm$^2$, the respective soldering pads 11a are covered with the upper peripheries of the films 14a and 14b excessively.

Figure 3D:
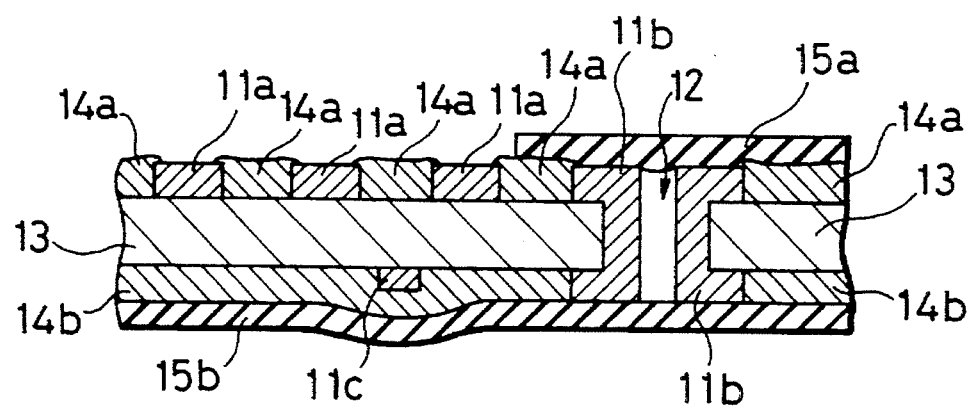

Next, as shown in FIG. 3D, etching resist films 15a and 15b are respectively formed on the first and second surfaces of the laminate 13 to cover the entire patterned first and second copper foils except for the soldering pads 11a. The remaining solder resist films 14a and 14b may or may not be covered with the etching resist films 15a and 15b, respectively. Here, the remaining solder resist films 14a and 14b are partially covered with the etching resist films 15a and 15b.

Any sort of etching resist material is applicable for this process and thicknesses of the etching resist films 15a and 15b are optional. Similar to the first embodiment, dry films are employed as the etching resist films 15a and 15b.

Figure 3E:
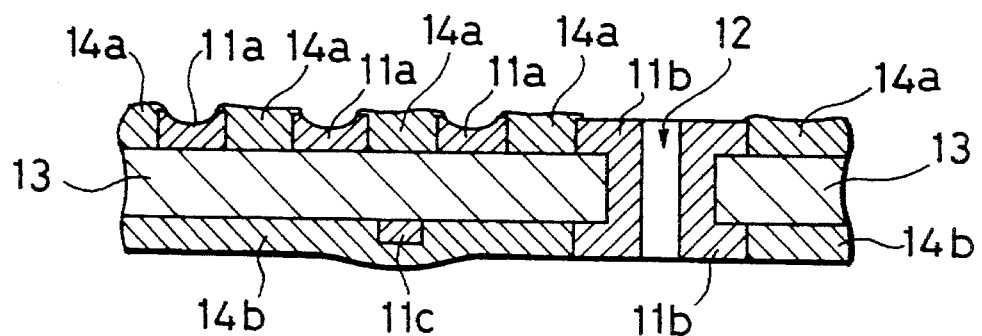

Subsequently, using the etching resist films 15a and 15b as masks, the surface areas of the soldering pads 11a are selectively etched by about 10 μm in depth. Thus, the soldering pads 11a become slightly smaller in height than the remaining solder resist films 14a and 14b, resulting in blocking dams for stopping solder flow from forming adjacent the respective soldering pads 11a, as shown in FIG. 3E.

Because the upper peripheries of the remaining solder resist films 14a and 14b are placed on the respective soldering pads 11a, the soldering pads 11a are etched to form part of a sphere. In other words, the tops of the soldering pads 11a have curved recesses, respectively. On the other hand, in the first embodiment, the tops of the soldering pads 1a have flat faces, respectively.

Also in the second embodiment, cupric chloride (CuCl$_2$) is employed as an etchant, however, any sort of etchants is applicable for this process. The soldering pads 14a and 14b thus etched are about 30 μm in thickness.

Figure 3F:
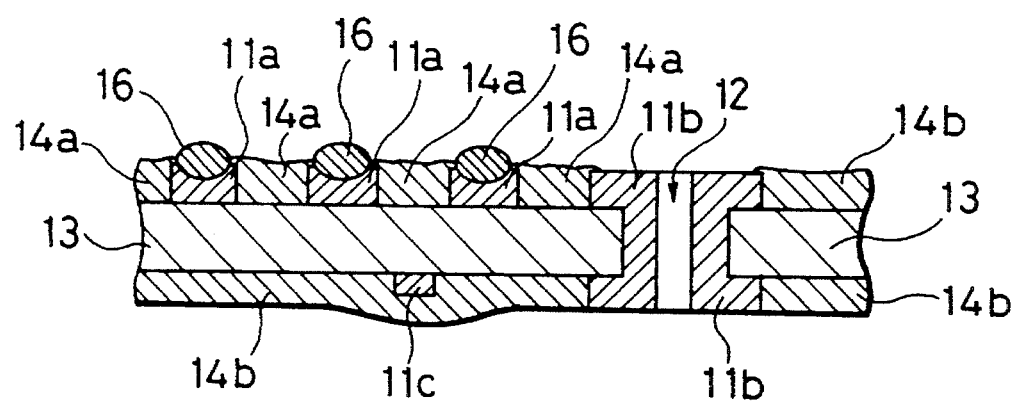

Since the tops of the respective soldering pads 11a are sunk, melted solder is selectively flowed on the respective soldering pads 11a. Thus, as shown in FIG. 3F, solder films 16 of about 20 μm in thickness are formed on the respective soldering pads 11a, resulting in a printed wiring board.

In a subsequent assembly process, desired electronic components and/or devices are placed on the soldering pads 11a to be mounted by soldering.

With the fabrication method of the second embodiment, the same advantages or effects can be obtained.

Also, there is an additional in that since the upper peripheries of the remaining solder resist films 14a and 14b are placed on the respective soldering pads 11a, the soldering pads 11a can be prevented from being torn off from the base material of the laminate 13 even if the pads 11a are thin in thickness.

In the above embodiments, though the copper-clad laminates have the first and second copper foils on each surface of the base material, they may have one copper foil on one surface thereof. Also, the copper foils may have any circuit patterns other than those shown in the attached figures.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A fabrication method of a printed circuit board having an insulating base material and a conductive layer affixed to a surface of said insulating base material, said fabrication method comprising the steps of:

(a) patterning said conductive layer to a given circuit pattern including a plurality of soldering pads;

(b) forming a solder resist film on said insulating base material to cover said patterned conductive layer;

(c) selectively exposing said solder resist film to irradiated light and a developing process so that said solder resist film is selectively left in areas adjacent to said plurality of soldering pads, said selective exposure being carried out utilizing reflection of said irradiated light reflected from said insulating base material;

(d) forming an etching resist film to cover said patterned conductive layer except for said plurality of soldering pads;

(e) selectively etching surface areas of said plurality of soldering pads using said etching resistant film as a mask to produce resist dams made of said solder resist film selectively left on said insulating base material; and (f) forming solder films on said plurality of soldering pads.

2. A method as claimed in claim 1, wherein minimum optical energy of said solder resist ranges from 50 to 100 mJ/cm$^2$.

3. A method as claimed in claim 1, wherein said irradiated light has excessive exposure energy for said solder resist film, and wherein said irradiated light is irradiated to said solder resist film so that peripheral areas of said plurality of soldering pads are covered with said solder resist film left in areas adjacent to said plurality of soldering pads in said step (c).

4. A method as claimed in claim 1, wherein optical energy of said irradiated light irradiated ranges from 700 to 1100 mJ/cm$^2$.

5. A method as claimed in claim 1, wherein optical energy of said irradiated light irradiated ranges from 700 to 750 mJ/cm$^2$.

6. A method as claimed in claim 1, wherein said irradiated light passes through said solder resist film to reach said insulating base material on a plurality of first areas where said plurality of soldering pads are not provided, said irradiated light being then reflected by said insulating base material to be irradiated to said solder resist film on said plurality of first areas;

said irradiated light passing through said solder resist film does not reach said insulating base material on a plurality of second areas where said plurality of soldering pads are provided; and said solder resist film on said plurality of first areas is selectively removed through said developing process of said step (c).

7. A method as claimed in claim 1, wherein said solder resist film is selectively cured by utilizing a halation effect of said irradiated light in said step (c).

8. A fabrication method of a printed circuit board, said fabrication method comprising the steps of:

(a) preparing an insulating base material having a conductive layer, said conductive layer being affixed to a surface of said insulating base material;

(b) patterning said conductive layer to form a given circuit pattern, said circuit pattern including a plurality of soldering pads;

(c) forming a solder resist film on said insulating base material to cover said patterned conductive layer;

(d) selectively exposing said solder resistant film to irradiated light and a developing process so that said solder resist film selectively remains in areas adjacent to said plurality of soldering pads, said selective exposure being carried out utilizing reflection of said irradiated light reflected from said insulating base material;

(e) forming an etching resist film to cover said patterned conductive layer except for said plurality of soldering pads;

(f) selectively etching surface areas of said plurality of soldering pads using said etching resist film as a mask to produce solder resist dams made of said solder resist film selectively left on said insulating base material; and (g) forming solder films on said plurality of soldering pads.

* * * * *